United States Patent
Unuma et al.

(10) Patent No.: US 10,962,449 B2
(45) Date of Patent: Mar. 30, 2021

(54) DIAGNOSTIC DEVICE AND DIAGNOSTIC METHOD FOR ROTARY MACHINE

(71) Applicant: Hitachi, Ltd., Tokyo (JP)

(72) Inventors: Munetoshi Unuma, Tokyo (JP); Junsuke Fujiwara, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 377 days.

(21) Appl. No.: 16/075,070

(22) PCT Filed: Mar. 8, 2016

(86) PCT No.: PCT/JP2016/057102
§ 371 (c)(1),
(2) Date: Aug. 2, 2018

(87) PCT Pub. No.: WO2017/154091
PCT Pub. Date: Sep. 14, 2017

(65) Prior Publication Data
US 2019/0003928 A1 Jan. 3, 2019

(51) Int. Cl.
*G01M 99/00* (2011.01)
*G01R 31/34* (2020.01)
(Continued)

(52) U.S. Cl.
CPC ............ *G01M 99/005* (2013.01); *G01M 7/00* (2013.01); *G01M 13/04* (2013.01); *G01R 31/343* (2013.01);
(Continued)

(58) Field of Classification Search
CPC ...... G01M 13/04; G01M 7/00; G01M 99/005; G01R 31/343; G01R 31/346; G01R 31/34; H02K 15/02; H02P 29/0241; G01H 1/00
(Continued)

(56) References Cited

U.S. PATENT DOCUMENTS

2010/0149699 A1 6/2010 Wei et al.
2010/0169030 A1* 7/2010 Parlos ................... G01H 1/00
702/58
(Continued)

FOREIGN PATENT DOCUMENTS

JP 2001-268986 A 9/2001
JP 2007-244082 A 9/2007
(Continued)

OTHER PUBLICATIONS

International Search Report (PCT/ISA/210) issued in PCT Application No. PCT/JP2016/057102 dated May 31, 2016 with English translation (four (4) pages).
(Continued)

*Primary Examiner* — John H Le
(74) *Attorney, Agent, or Firm* — Crowell & Moring LLP

(57) ABSTRACT

A rotary machine diagnostic device has a current acquisition unit that acquires current from a sensor, which measures the driving current of a rotary machine driving a machine to be driven; a sampling unit that performs sampling of the acquired driving current; a frequency range conversion unit that converts data concerning the time range subjected to sampling into a frequency range; a sideband detection unit that sets the driving current as a carrier wave in the frequency range, and detects, as a sideband, the spectrum appearing on each side of the carrier wave subjected to amplitude modulation; and an abnormality detection unit that detects whether or not there are abnormalities in the rotary machine and the machine to be driven on the basis of the difference in frequency between the sideband frequency detected by the sideband detection unit and the frequency of the carrier wave.

9 Claims, 16 Drawing Sheets

(51) Int. Cl.
*G01M 13/04* (2019.01)
*H02K 15/02* (2006.01)
*H02P 29/024* (2016.01)
*G01M 7/00* (2006.01)

(52) U.S. Cl.
CPC ........... *G01R 31/346* (2013.01); *H02K 15/02* (2013.01); *H02P 29/0241* (2016.02)

(58) Field of Classification Search
USPC .................................................. 702/34, 58
See application file for complete search history.

(56) References Cited

U.S. PATENT DOCUMENTS

2012/0262131 A1* 10/2012 Lee .................... H02P 29/0241
322/99
2014/0160602 A1* 6/2014 Gu ........................ G01R 31/34
361/31

FOREIGN PATENT DOCUMENTS

JP   2010-288352 A   12/2010
JP   2015-004694 A   1/2015

OTHER PUBLICATIONS

Japanese-language Written Opinion (PCT/ISA/237) issued in PCT Application No. PCT/JP2016/057102 dated May 31, 2016 (four (4) pages).
Toyoda T., "Diagnosis Technique for Electric-Motor Driven Rotary Machine by Current Signature Analysis MSCA", Takada Technical Report, vol. 20, Apr. 2010, Japan (four (4) pages).

* cited by examiner

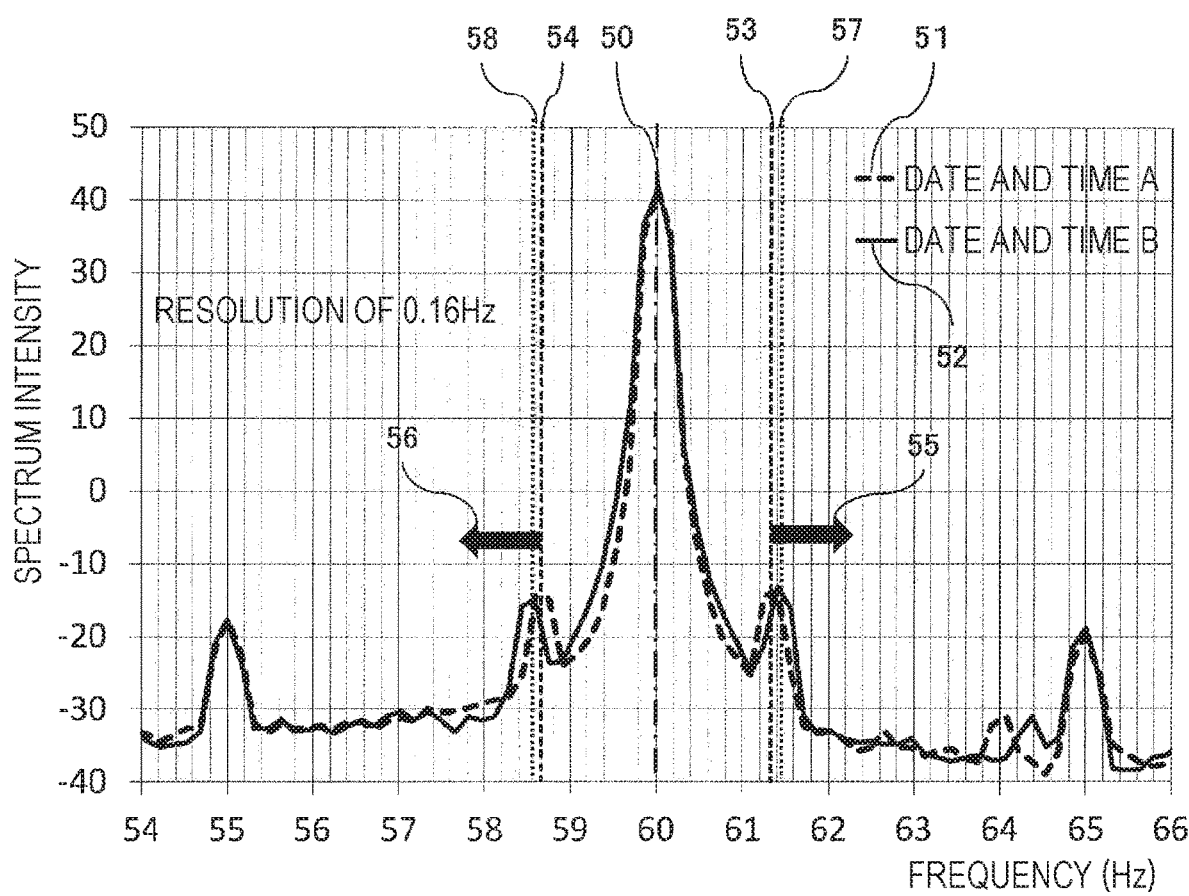

ENLARGED VIEW OF PEAK VALUE SECTION OF DRIVING CURRENT

DETECTION PROCESS

WAVEFORM AFTER DETECTION (MODULATED SIGNAL)

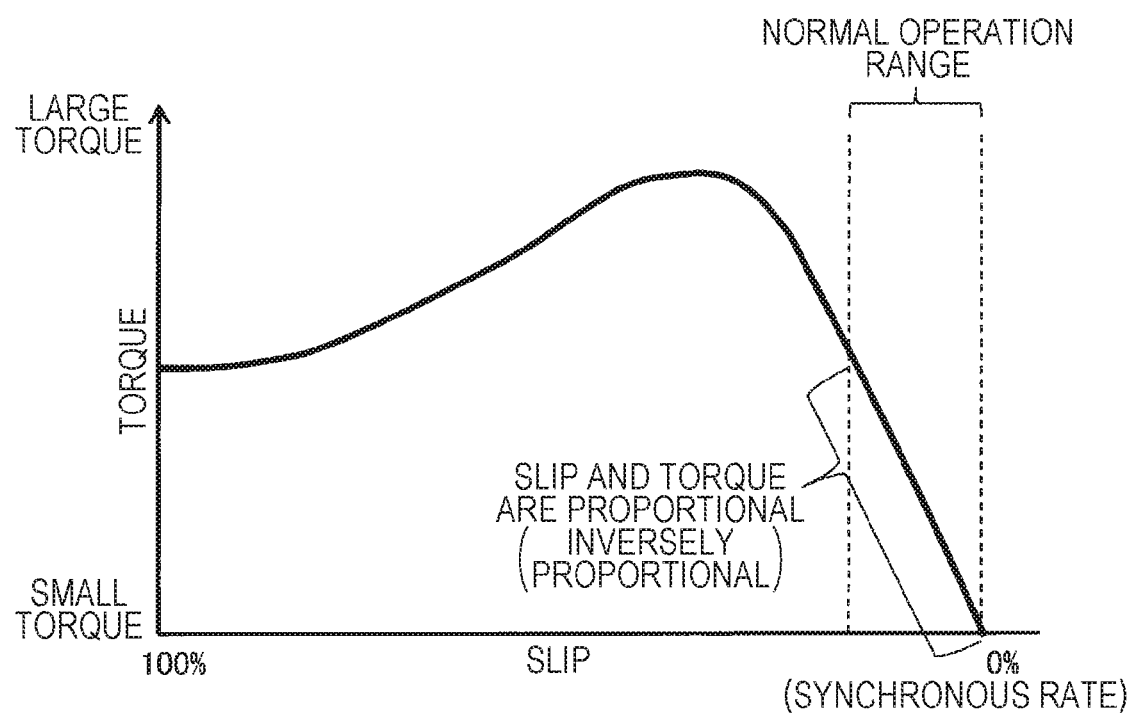

DIAGNOSTIC DEVICE AND DIAGNOSTIC METHOD FOR ROTARY MACHINE

TECHNICAL FIELD

The present invention relates to a diagnostic device and a diagnostic method for making a diagnosis for an abnormality in a rotary machine and a driven machine that is to be driven by the rotary machine.

BACKGROUND ART

There has been developed a method for detecting a failure and/or an abnormal state of an instrument by use of various sensors attached to the device. PTL 1 discloses a method for making a diagnosis for an abnormality in a rotary machine system including an electric motor whose load side includes a gear. According to this method, after a current signal obtained while the electric motor is operating is sampled and is subjected to a filtering process with a high-pass filter, the resulting current signal, which is time-series current signal, is subjected to an envelope process through envelope detection and is further to fast Fourier transform. Then, if a group of spectrum peaks appearing at and/or near a frequency obtained by multiplying a rotational frequency of a gear shaft by an even number is detected, it is determined that an abnormality has occurred in a bearing of the gear in the rotary machine system or in engagement of the gear.

PTL 2 discloses a method for making a diagnosis for an abnormality in equipment that includes: an induction motor; a device to be driven by the induction motor; and a coupling for connecting the induction motor and the device to each other. This method includes: a current measurement step of measuring a load current of the induction motor for at least one phase; a frequency analysis step of performing frequency analysis on the load current thus measured; and an abnormality determination step of determining whether or not the equipment has an abnormality, based on at least either of the presence or absence, in a waveform resulting from the frequency analysis, of sidebands appearing on both of a high-frequency side and a low-frequency side of an operating frequency that is a frequency of a voltage applied to the induction motor, and positions and magnitudes of the sidebands, and of determining the type of the abnormality in the equipment, if the abnormality in the equipment is present. Both of the literatures describe a method for making a diagnosis for an abnormality in a rotary machine based on changes in driving current of the rotary machine.

CITATION LIST

Patent Literature

PTL 1: JP 2015-4694 A
PTL 2: JP 2010-288352 A

Non-Patent Literature

NPL 1: Toshio Toyoda, "Denryu Choukou Kaiseki MCSA ni voru Dendouki Kudou Kaitenki no Shindan Gijutsu [Diagnosis Technique for Electric-Motor Driven Rotary Machine by Current Signature Analysis MCSA]", Takada Technical Report, Vol. 20, April 2010, Retrieved Feb. 17, 2016 from http://www.takada.co.jp/giho/pdf/gihou20/kikou_1.pdf

SUMMARY OF INVENTION

Technical Problem

PTL 1 describes a method for detecting an abnormality in engagement of the gear by determining whether or not a peak appears at a frequency obtained by multiplying a rotational frequency of the gear by an even number, as well as a method for detecting an abnormality in shaft alignment based on a difference between a spectrum intensity of a power supply frequency and a spectrum intensity appearing at a position deviated from the power supply frequency by a rotational frequency of the shaft.

According to PTL 2, in a case where the load fluctuates greatly, the sideband frequency changes continuously in a range of ±0 to ±some Hz, and accordingly a waveform as those illustrated in FIG. 5(b) of PTL 2 is exhibited. This waveform is shown as an example of a position of a theoretical waveform of a normal induction motor.

NPL 1 discloses that, when a rotor has unevenness, a sideband frequency $f_{pp}$ can be expressed as below as a function of slip s and a power supply frequency $f_L$:

$f_{pp} = 2s \cdot f_L$ ... (1). In addition, NPL 1 discloses a method for detecting, with use of this formula, a damage of a rotor bar based on a difference between a spectrum intensity of the power supply frequency $f_L$ and a spectrum intensity of the sideband frequency $f_{pp}$.

If an abnormality occurs in a rotary machine and a driven machine to be driven by the rotary machine, a mechanical loss and/or a copper loss increases. The mechanical loss refers to a loss considered from a mechanical viewpoint, and the copper loss refers to a loss considered from an electrical viewpoint. However, neither of the above literatures discloses nor describes a means for detecting the amount(s) of such an increase(s) based on a driving current.

The present invention was made in order to solve the above problem. An object of the present invention is to provide a diagnostic device and a diagnostic method for a rotary machine, each capable of detecting, based on a driving current, an abnormality (especially, an increase in mechanical loss and/or copper loss) in the rotary machine and a driven machine to be driven by the rotary machine.

Solution to Problem

In order to attain the above object, a diagnostic device for a rotary machine according to the present invention includes: a current acquisition unit configured to acquire a current from a sensor that measures a driving current of the rotary machine driving a driven machine; a sampling unit configured to perform sampling on the driving current thus acquired; a frequency range conversion unit configured to convert time-range data having been subjected to the sampling into a frequency range; a sideband detection unit configured to set, in the frequency range, the driving current as a carrier wave and detect, as a sideband, a portion of a spectrum appearing on each side of the carrier wave having been amplitude-modulated; and an abnormality detection unit configured to determine whether or not the rotary machine and the driven machine have an abnormality, based on a frequency difference between at least one of frequencies of the sidebands detected by the sideband detection unit and a frequency of the carrier wave. Other aspects of the present invention will be described in the below-described embodiments.

Advantageous Effects of Invention

According to the present invention, it is possible to detect, based on a driving current, an abnormality (an increase in mechanical loss and/or copper loss) in a rotary machine and a driven machine that is to be driven by the rotary machine.

BRIEF DESCRIPTION OF DRAWINGS

In FIG. 4A illustrates a waveform of a driving current, and FIG. 4B is an enlarged view of a peak value section of the driving current.

FIG. 5 is a view illustrating an appearance of sidebands.

In FIG. 10A is an enlarged view of a peak value section of a driving current, FIG. 10B is a view illustrating the detection process, and FIG. 10C is a view illustrating a waveform after the detection (modulated signal).

FIG. 17 is a view illustrating a relation between slip and torque.

DESCRIPTION OF EMBODIMENTS

Embodiments of the present invention will be described in detail below with reference to the drawings.

First Embodiment

Figure 1:
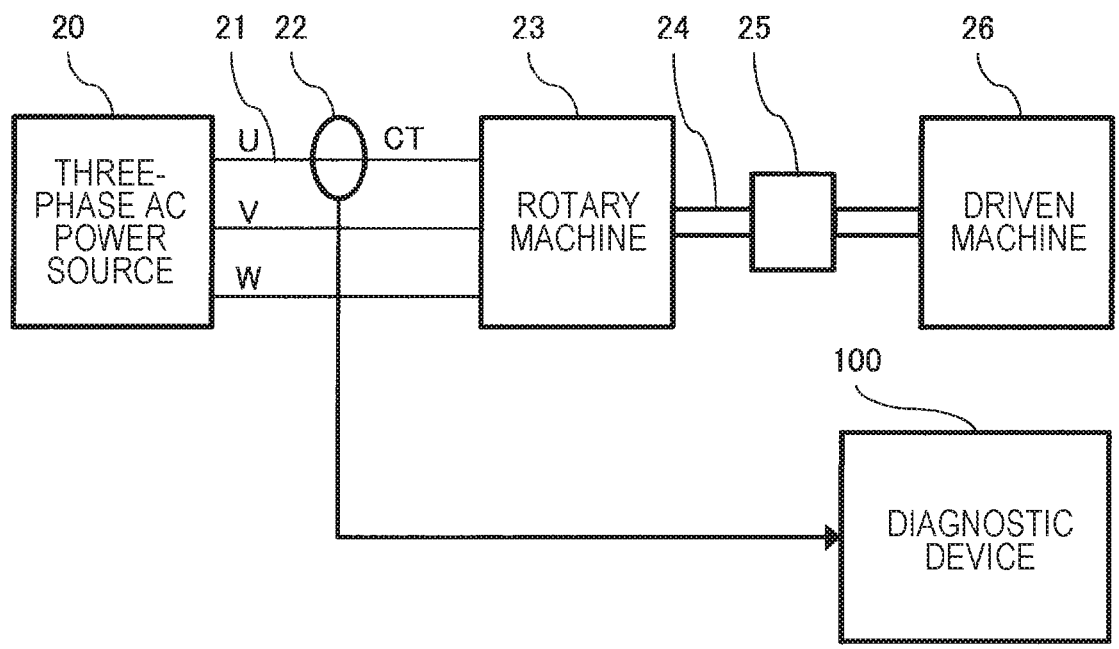
FIG. 1 is a view illustrating arrangement of a rotary machine, a driven machine that is to be driven by the rotary machine, and a diagnostic device according to the embodiment.

FIG. 1 is a view illustrating arrangement of a rotary machine, a driven machine that is to be driven by the rotary machine, and a diagnostic device according to the present embodiment. The reference sign "23" denotes a rotary machine, and the reference sign "20" denotes a three-phase alternating current (AC) power source for driving the rotary machine 23. The three-phase AC power source 20 may be either of a commercial power source and an inverter power source. The reference sign "22" denotes a current sensor (CT) attached to a U phase 21. Although the current sensor 22 is attached to the U phase in FIG. 1, the current sensor 22 may alternatively be attached to another phase such as a V phase or a W phase. The reference sign "26" denotes a driven machine that is driven by the rotary machine 23. The reference sign "24" denotes a rotation shaft of the rotary machine 23, and the reference sign "25" denotes a power transmission device, such as a joint, a belt, and/or a gear, for transmitting motive power from the rotary machine 23 to the driven machine 26.

A diagnostic device 100 of the present embodiment makes a diagnosis based on input data that is an output from the current sensor 22. A mechanical loss to be detected by the diagnostic device 100 refers to a mechanical loss that has been increased due to a failure(s) in a bearing of the rotary machine 23, in the power transmission device 25, in the driven machine 26, and/or the like. A copper loss refers to a copper loss in a coil of the rotary machine 23. The diagnostic device 100 determines whether or not the copper loss and/or the mechanical loss has increased, and outputs an abnormality if present.

First, the following will describe an overview of processes performed by the diagnostic device 100 for the rotary machine according to the present embodiment.

(1) Sidebands are detected from a driving current. The "sidebands" refer to the "sideband frequency" described in PTL 2. Hereinafter, in the description of the first embodiment, the "sidebands" refer to portions of a spectrum appearing on both sides of a carrier wave having been amplitude-modulated, the driving current being set as the carrier wave.

(2) History of time-dependent changes in sideband frequency is accumulated. As is clear from formula (1), the sideband frequency is proportional to the slip s. The slip s is proportional to a mechanical output and a copper loss. Thus, the slip s represents an increase in mechanical loss and/or copper loss caused by aging deterioration, where a load of the rotary machine is constant.

(3) A comparison among fluctuations of the sideband frequency is made. If the sideband frequency exceeds a predetermined frequency (i.e., a predetermined mechanical loss and a predetermined copper loss), it is determined that an abnormality has occurred.

By performing such processes, it is possible to attain the above object. The following part of the first embodiment will describe detection of an abnormality based on time-dependent changes of sidebands.

Figure 2:
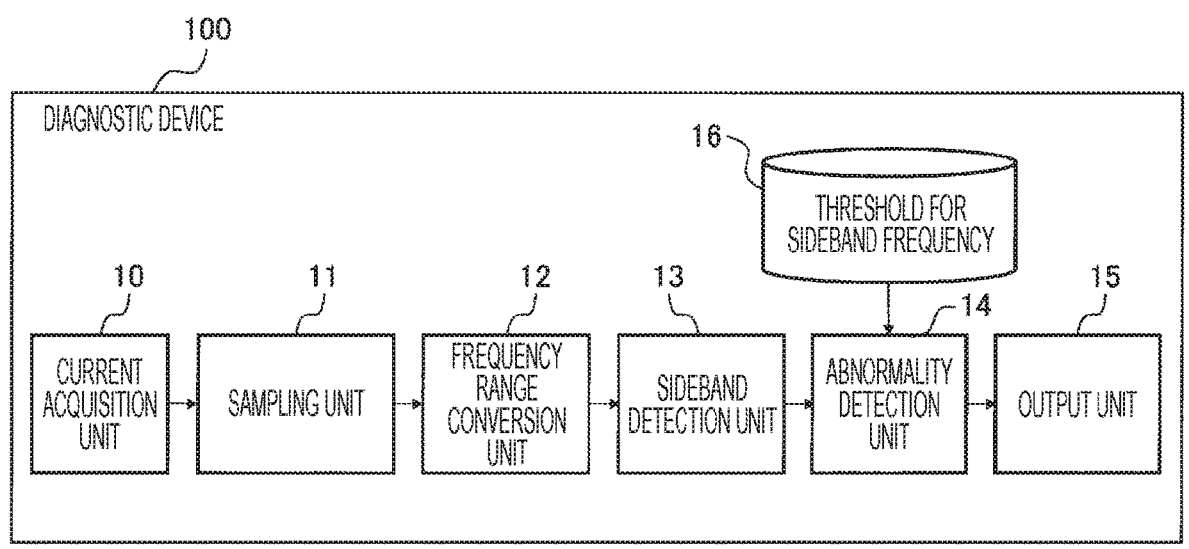
FIG. 2 is a view illustrating process blocks of a diagnostic device according to the first embodiment.

FIG. 2 is a view illustrating process blocks of the diagnostic device according to the first embodiment. A diagnostic device 100 includes: a current acquisition unit 10 configured to acquire a current from the current sensor 22 that measures a driving current of the rotary machine 23 driving the driven machine 26; a sampling unit 11 configured to perform sampling on the driving current thus acquired; a frequency range conversion unit 12 configured to convert time-range data having been subjected to the sampling into a frequency range; a sideband detection unit 13 configured to set, in the frequency range, the driving current as a carrier wave and detect, as sidebands, portions of a spectrum appearing on both sides of carrier wave having been amplitude-modulated; an abnormality detection unit 14 configured to determine whether or not the rotary machine 23 and the driven machine 26 have an abnormality, based on a frequency difference between at least one of frequencies of the sidebands detected by the sideband detection unit 13 and a frequency of the carrier wave; and an output unit 15. The abnormality detection unit 14 determines whether or not the rotary machine 23 and the driven machine 26 have an abnormality by, e.g., comparison between an index (for example, the slip s and/or the sideband frequency $f_{pp}$) related to the sidebands and a predetermined threshold. In a storage unit 16, information such as data indicative of results of the processes performed by the units and/or the threshold for the sideband frequency $f_{pp}$ to be used by the abnormality detection unit 14 is stored.

Figure 3:
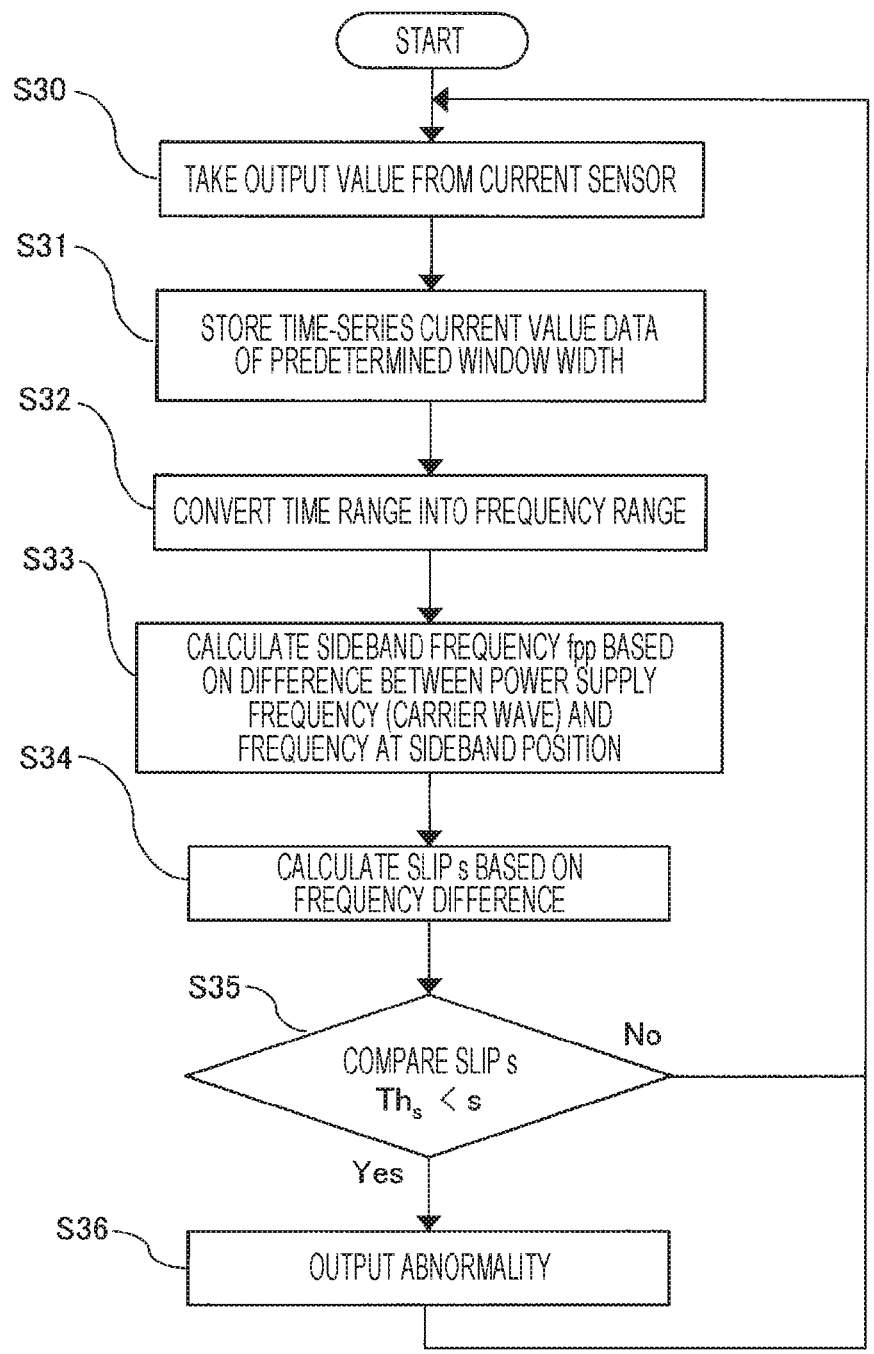
FIG. 3 is a flowchart illustrating processes to be performed by the diagnostic device according to the first embodiment.

FIG. 3 is a flowchart illustrating processes to be performed by the diagnostic device according to the first embodiment. Each of the processes will be described with reference to FIG. 2 as needed.

(Process S30)

The current acquisition unit 10 takes an output value (analog value) from the current sensor 22. The sampling unit converts the output value into a digital value. FIG. 4 illustrates one example of the waveform of the driving current.

Figure 4A:
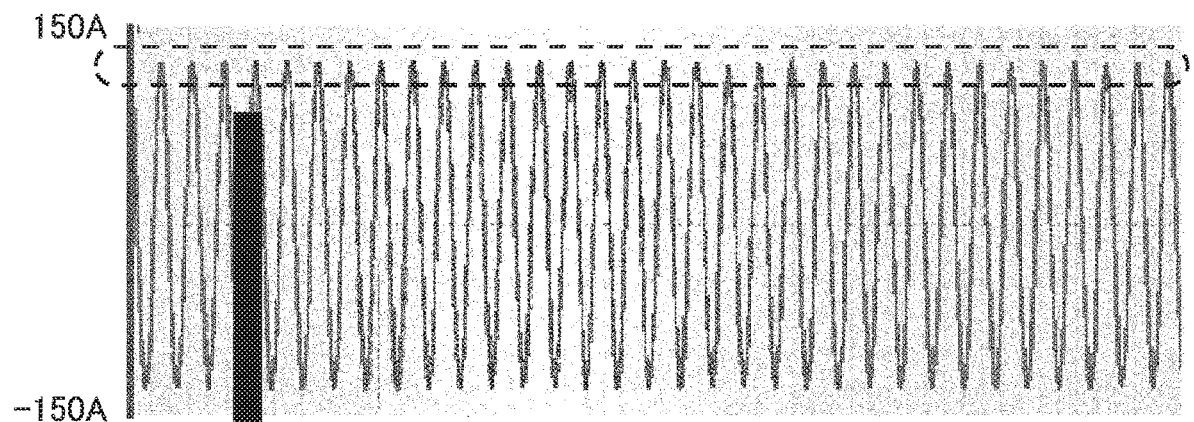
FIGS. 4A and 4B are views illustrating an appearance of the waveform of the driving current.
Figure 4B:
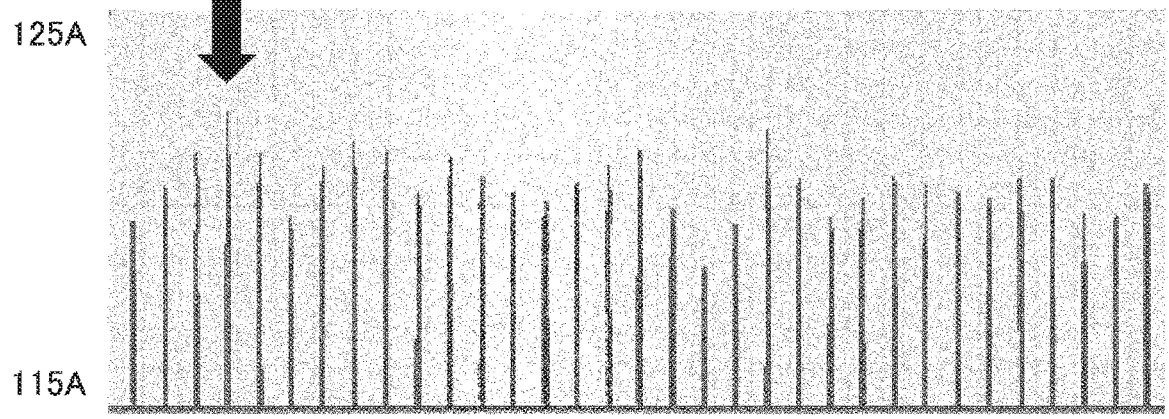

FIG. 4 is a view illustrating an appearance of the waveform of the driving current. In FIG. 4, (a) illustrates the waveform of the driving current, and (b) is an enlarged view of a peak value section of the driving current. The driving current in FIG. 4(a) is shown at a scale at which the entire driving current is visible. The power source in this example was configured to provide a three-phase AC waveform. Therefore, the waveform illustrated in FIG. 4(a) was like a sinusoidal wave. FIG. 4(b) is an enlarged view of a portion of FIG. 4(a) surrounded by a broken line, the portion including the peak value section of the sinusoidal wave. In FIG. 4(a), it seems that the waveform had a constant amplitude. However, the enlarged view shows the presence of fluctuations in the amplitude of the current. The fluctuations represent slip of the rotary machine (this will be described later).

(Process S31)

Referring back to FIG. 3, the sampling unit 11 stores, in the storage unit 16, time-series current data for a single process cycle, which is time-series current data corresponding to a window width that is to be used in conversion into a frequency range in process S31.

(Process S32)

The frequency range conversion unit 12 converts the time-series time-range data into a frequency range. The conversion may performed by, e.g., fast Fourier transform (FFT) or discrete Fourier transform (BFT). FIG. 5 illustrates one example of the frequency range resulting from the conversion.

FIG. 5 is a view illustrating an appearance of the sidebands. The horizontal axis represents a frequency, and the vertical axis represents a current spectrum intensity. FIG. 5 shows date and time A (51) and date and time B (52) at which equal loads were applied on the driven machine 26. The date and time A (51) is a point in time shortly after the device was started. The date and time B (52) is a point in time after a long period of time had elapsed since the device was started. The device was driven by a commercial power source of 60 Hz. The reference sign "50" denotes a portion of a spectrum corresponding to a power supply frequency. The sidebands at the date and time A (51) correspond to portions of the spectrum at frequencies 53 and 54. The sidebands at the date and time B (52) correspond to portions of the spectrum at frequencies 57 and 58.

(Process S33)

Referring back to FIG. 3, the sideband detection unit 13 calculates a sideband frequency $f_{pp}$ based on a frequency difference between the power supply frequency (carrier wave) and the frequency at the position of the sideband.

Assume that the frequencies 53 and 54 at the date and time A are represented by $f_{USB}$ and $f_{LSB}$, respectively. Then, the sideband frequency $f_{pp}$ at the date and time A is represented by the following formula, where the power supply frequency is $f_L$.

$$f_{pp} = f_{USB} - f_L \quad (2)$$

$$f_{pp} = f_L - f_{LSB} \quad (3)$$

Either of $f_{USB}$ and $f_{LSB}$ may be used, since $f_{USB}$ and $f_{LSB}$ appear in a bilateral symmetrical manner with respect to $f_L$.

(Process S34)

The sideband detection unit 13 calculates slip s based on the frequency difference between the power supply frequency (carrier wave) and the frequency at the position of the sideband. Based on the relation, shown by formula (1), between the sideband frequency $f_{pp}$, the power supply frequency $f_L$, and the slip s, the slip s is expressed by formula (4) below.

$$s = f_{pp} / (2 \cdot f_L) \quad (4)$$

In a case where the value of the slip s is not more than some %, the torque and the slip are in proportion to each other. Thus, an increase in slip can be considered as an increase in torque, that is, an increase in mechanical loss and/or copper loss.

Comparing the sidebands at the date and time A (51) with the sidebands at the date and time B (52) in FIG. 5, it is shown that the sidebands had moved slightly outside (in a direction away from the carrier wave, as indicated by 55 and 56) relative to the center that is the carrier wave. The reasons for this is as follows. That is, the measured data at the date and time B was acquired after some time had elapsed since the use of the device was started, and therefore the slip increased due to an increase in mechanical loss and/or copper loss caused by aging deterioration.

(Process S35)

Referring back to FIG. 3, the abnormality detection unit 14 compares the slip s thus obtained with a slip threshold $Th_s$ for an abnormal state. If the slip s exceeds the slip threshold $Th_s$ (Yes in process S35; in a case of an abnormal state), the process advances to process S36. Meanwhile, if the slip s is not more than the slip threshold $Th_s$ (No in process S35), the process returns to process S30.

(Process S36)

Figure 6:
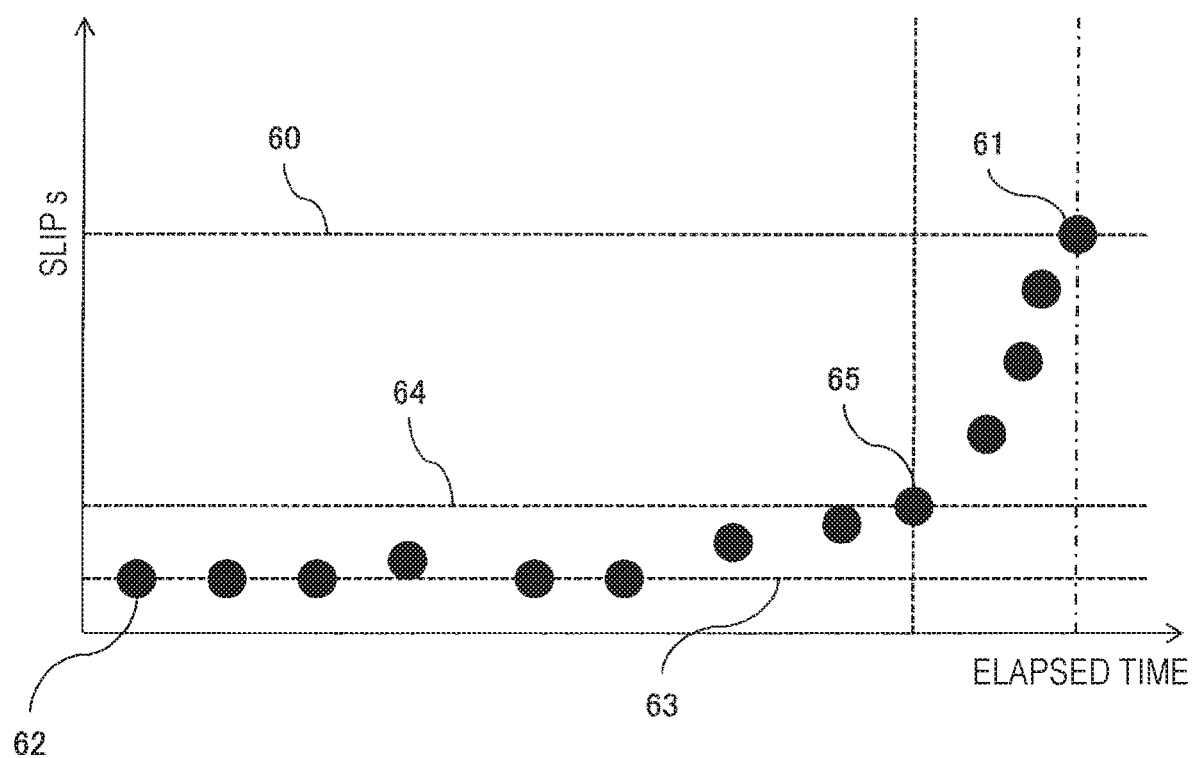
FIG. 6 is a view illustrating time-dependent changes of slip.

In the case of the abnormal state, the abnormality detection unit 14 notifies the output unit 15 of the abnormality, and the process returns to process S30. FIG. 6 schematically illustrates how the threshold $Th_s$ for the slip s is defined and determined.

FIG. 6 is a view illustrating time-dependent changes of slip. The horizontal axis represents an elapsed time since the device started operating, and the vertical axis represent slip s. In one example, a direction for defining a slip threshold $Th_s$ for an abnormal state uses the value of slip s measured in a machine that was determined to have a failure in the past. Assume that the value of the slip measured when the machine had a failure was 60. If a loss gradually increases due to mechanical and electrical deterioration with lapse of time and accordingly the value of the slip reaches 61, which is above the slip threshold $Th_s$ for an abnormal state, it is determined to be abnormal.

In another example, an increase rate for determining a failure or a caution state may be defined in advance based on the value of slip s measured shortly after the machine started operating. In the example illustrated in FIG. 6, in a case where a slip state measured shortly after the machine started operating is 62, a normal reference is set at 63, and a value (64) that is twice the reference value is set as a slip threshold $Th_s$, at which caution is necessary. According to such a setting, an output indicative of an abnormality or a caution may be issued when the slip s increases with lapse of time and reaches 65, which is above the threshold 64.

As described above, by observing shifting of the frequency of the sideband in the carrier wave that is the power supply frequency of the driving current, it is possible to detect an abnormality in the machine.

Figure 7:
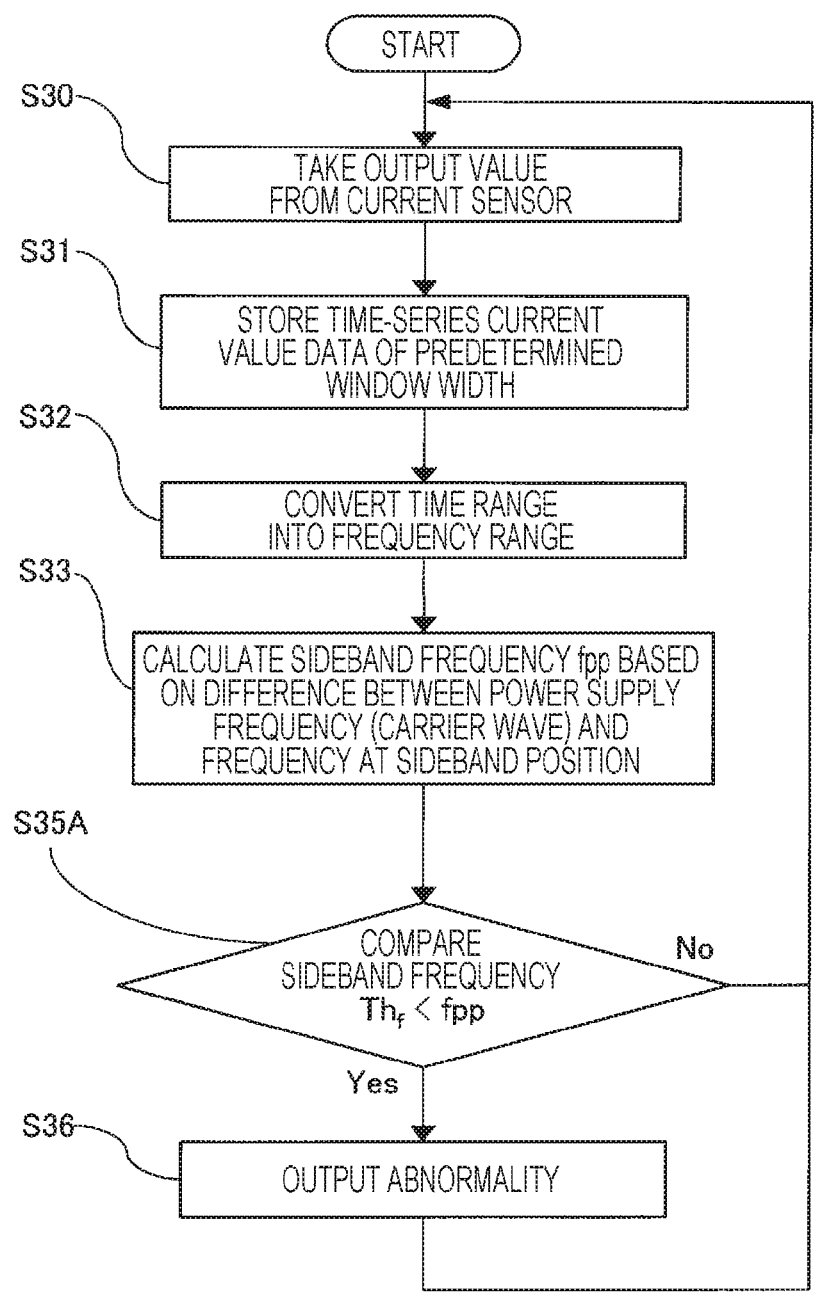
FIG. 7 is a flowchart illustrating other processes to be performed by the diagnostic device according to the first embodiment.

The process described above uses the frequency shifting of the slip s. Alternatively, similar effects can be achieved by the process involving use of torque obtainable based on the sideband frequency $f_{pp}$ and/or the slip s, each of which is proportional to torque. FIG. 7 illustrates processes to be performed by the diagnostic device with use of the sideband frequency $f_{pp}$.

FIG. 7 is a flowchart illustrating other processes to be performed by the diagnostic device according to the first embodiment. Comparing FIG. 7 to FIG. 3, process S33 and the subsequent processes in FIG. 7 are different from those in FIG. 3. In FIG. 7, the abnormality detection unit 14 compares a sideband frequency $f_{pp}$ with a threshold $Th_f$ for a sideband frequency in an abnormal state. If the sideband frequency $f_{pp}$ exceeds the threshold $Th_f$ for the sideband frequency (Yes in process S35A; in a case of an abnormal state), the process advances to process S36. Meanwhile, if the sideband frequency is not more than the threshold $Th_f$ for the sideband frequency $f_{pp}$ (No in process S35A), the process returns to process S30. Then, in process S36, in the case of the abnormal state, the abnormality detection unit 14 notifies the output unit 15 of the abnormality, and the process returns to process S30.

Second Embodiment

In a second embodiment, a diagnostic device 100A in which a resolution is improved by a detection process will be described.

In the first embodiment, the process of data conversion into a frequency range is performed on the data having been taken at a sampling rate with which the sinusoidal wave of the driving current illustrated in FIG. 4 can also be reproduced in the conversion window width during the conversion into the frequency range. Consequently, as illustrated in FIG. 5, the relation between the power supply frequency and the sidebands can be visualized.

However, the frequency difference between the sideband (53) at the date and time A and the sideband (57) at the date and time B illustrated in FIG. 5 is quite small. By increasing the window width used in the process of data conversion into a frequency range, the frequency resolution can be increased. However, if the window width is increased on the condition that the shape of the waveform of the carrier wave should be maintained (the peak values of the sinusoidal wave should be reproduced), a large number of data points are required.

For example, in the example illustrated in FIG. 5, the frequency resolution of 0.16 Hz was obtained with a sampling rate of 10.24 kHz, a window width of six seconds, and 65536 data points. Increasing the window width can increase the frequency resolution. However, this increases computational complexity, thereby making it difficult to perform the process.

In order to calculate slip s, a frequency difference (sideband frequency $f_{pp}$) between the carrier wave and the sideband is necessary, and the frequency position of the carrier wave is not necessary. Specifically, the sideband frequency $f_{pp}$ can be obtained by separating (detecting) the sidebands (modulated signal) and converting the modulated signal into a frequency range. Thus, this process uses the signal separated from the carrier wave, and therefore does not need a sampling frequency for reproducing the carrier wave. Instead, this process only needs a sampling frequency with which the modulated signal can be reproduced.

Specifically, consider a case where a carrier wave of 60 Hz is used. In this case, a signal that can be modulated has a frequency of 60 Hz or lower or a frequency of 120 Hz or lower. Therefore, sampling may be performed with a sampling frequency of approximately 60 Hz or approximately 120 Hz. Consequently, a frequency resolution that is the same or similar to that of FIG. 5 may be obtained with sampling points whose number is approximately one eighty fifth of that of FIG. 5. Consequently, it is possible to further increase the window and to increase the frequency resolution. In the following part of the second embodiment, a means for improving the resolution of a slip change through the detection process will be described.

Figure 8:
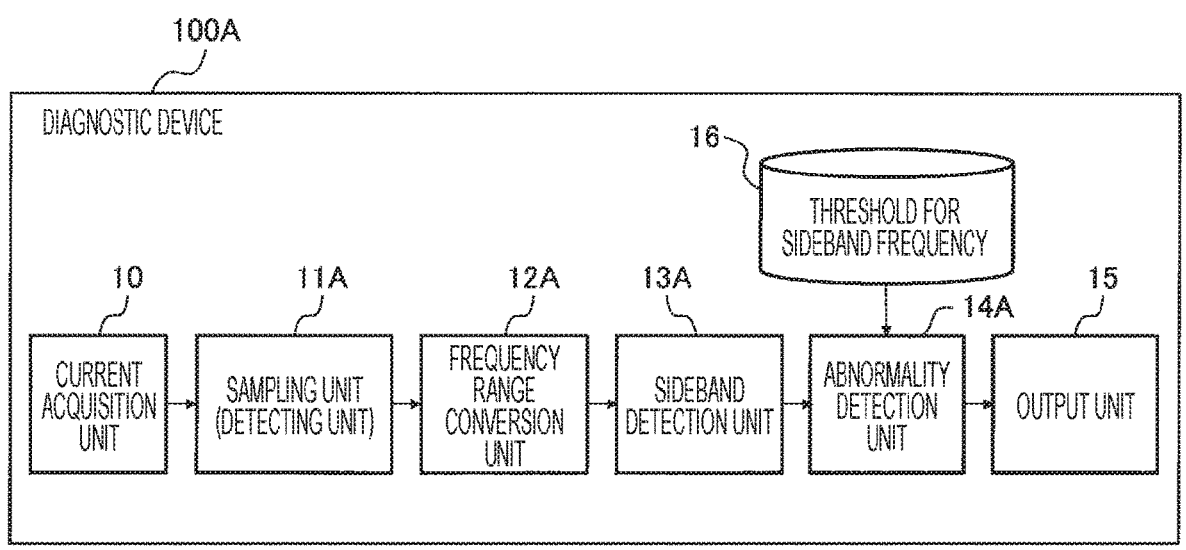
FIG. 8 is a view illustrating process blocks of a diagnostic device according to a second embodiment.

FIG. 8 is a view illustrating process blocks of the diagnostic device according to the second embodiment. In FIG. 8, identical functions to those of FIG. 2 are given identical reference signs. The diagnostic device 100A includes: a current acquisition unit 10; a sampling unit 11A (detecting unit) configured to perform sampling on a modulated signal obtained by setting a driving current as a carrier wave and performing a detection process on an amplitude-modulated part of the carrier wave; a frequency range conversion unit 12A configured to convert time-range data having been subjected to the sampling into a frequency range; a sideband detection unit 13A configured to detect, in the frequency range, sidebands that are portions of a spectrum corresponding to the modulated signal; an abnormality detection unit 14A configured to determine whether or not the rotary machine 23 and the driven machine 26 have an abnormality, based on frequencies at the positions of the sidebands detected by the sideband detection unit 13A; and an output unit 15. In a storage unit 16, information such as data indicative of results of processes performed by units and/or a threshold for a sideband frequency to be used by the abnormality detection unit 14A are stored.

Figure 9:
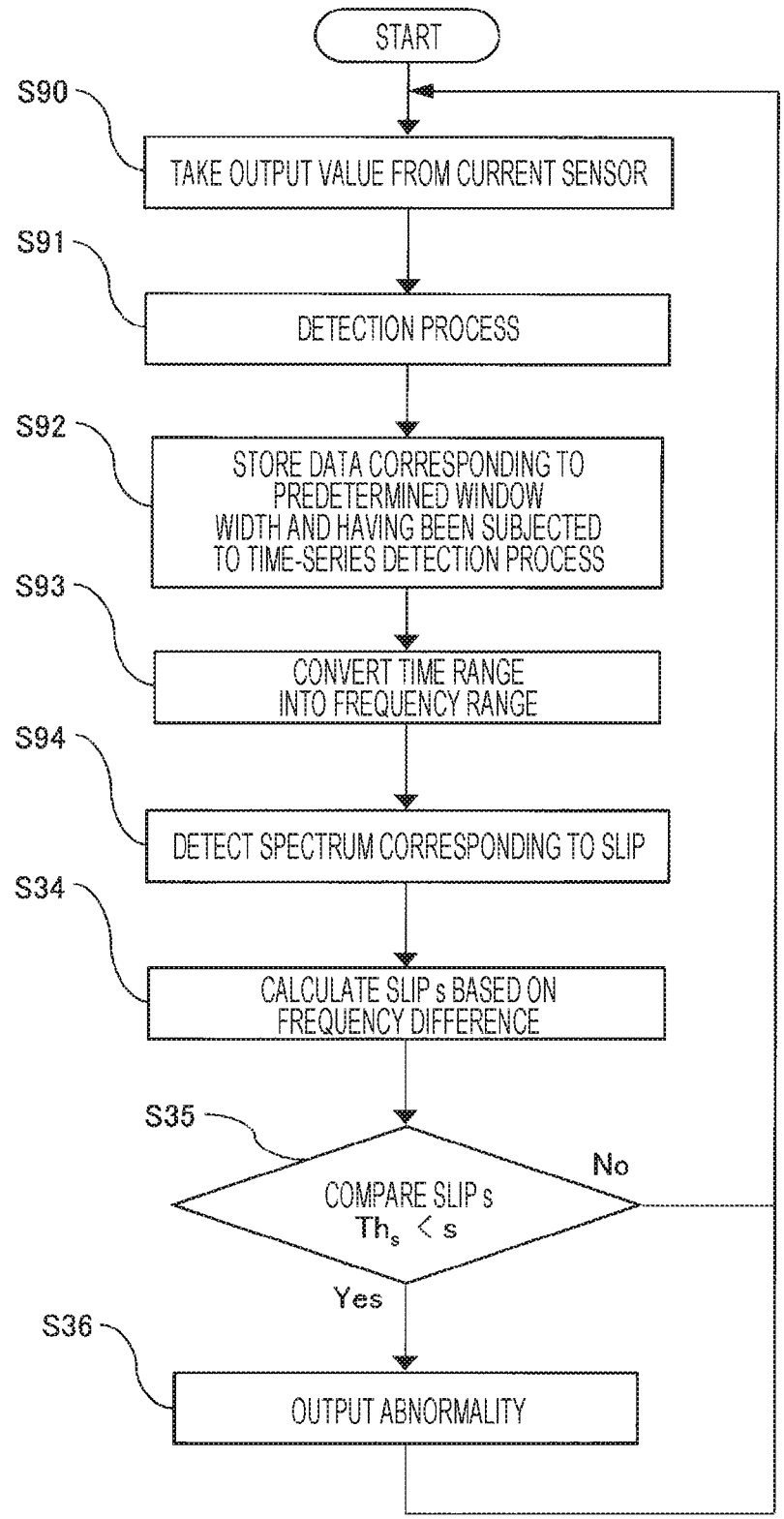
FIG. 9 is a flowchart illustrating processes to be performed by the diagnostic device according to the second embodiment.

FIG. 9 is a flowchart illustrating processes to be performed by the diagnostic device according to the second embodiment. Each of the processes will be described with reference to FIG. 8 as needed.

(Process S90)

The current acquisition unit 10 takes an output value (analog value) from a current sensor 22.

(Process S91)

In a case where the detection process in process S91 is an analog process, the sampling unit 11A (detection process unit) takes the data as an analog value. Meanwhile, in a case where the detection process in process S91 is a digital process, the sampling unit 11A takes the data as a digital value. Then, the sampling unit 11A performs the detection process on the data thus taken. An overview of the detection process is illustrated in FIG. 10.

Figure 10A:
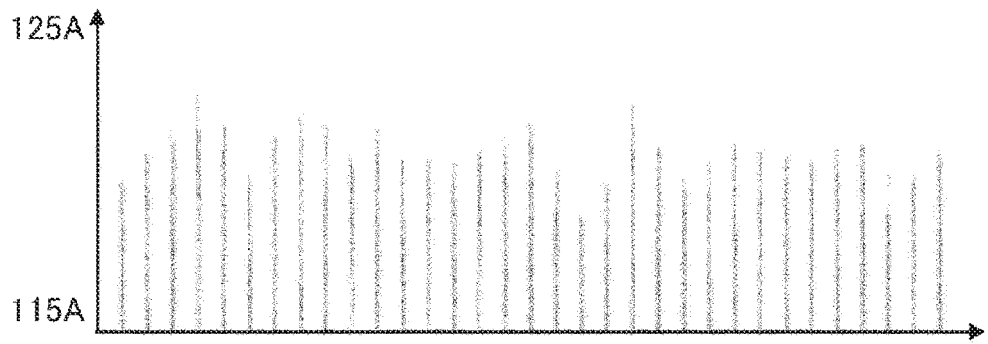
FIGS. 10A to 10C are views illustrating an overview of a detection process.
Figure 10B:
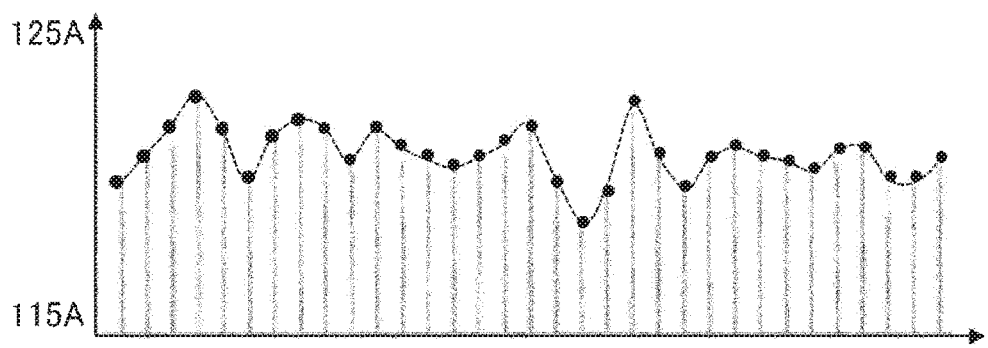
Figure 10C:
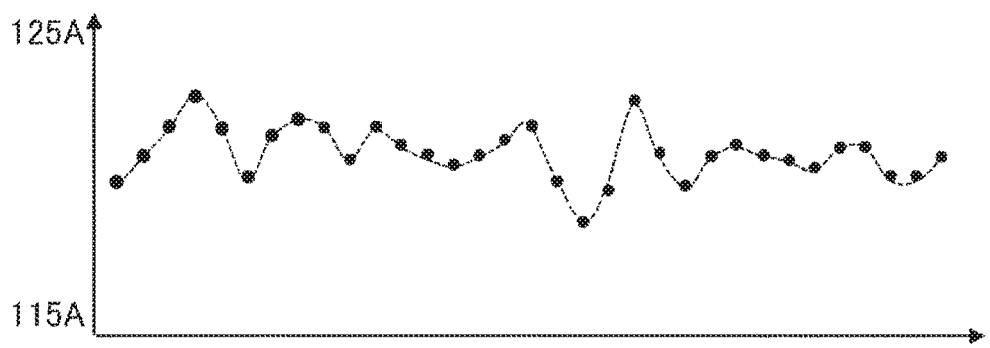

FIG. 10 is a view illustrating the overview of the detection process. In FIG. 10, (*a*) is an enlarged view of a peak value section of the driving current, (*b*) is a view illustrating the detection process, and (*c*) is a view illustrating a waveform after the detection (modulated signal). As illustrated in FIG. 10(*a*), the driving current was amplitude-modulated due to torque fluctuations (slip), so that fluctuations occurred in the current waveform. Thus, the detection process may be performed on the amplitude-modulated part of the carrier wave that is a power supply frequency. That is, the detection process refers to a method in which a curve (or an envelope) obtained by connecting peak values of a current waveform as those illustrated in FIG. 10(a) is generated, and then a waveform as those illustrated in FIG. 10 (c) is generated through a process as those illustrated in FIG. 10(b). The waveform as those illustrated in FIG. 10(c) can be generated by various techniques. Some of such techniques will be described below.

{First Detection Technique}

Figure 11:
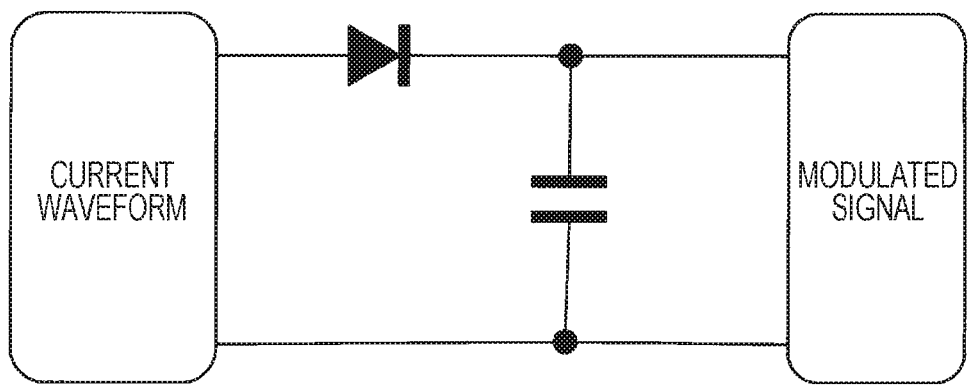
FIG. 11 is a view illustrating a first detection technique.

FIG. 11 is a view illustrating a first detection technique. The first detection technique is a detection technique involving use of a diode and a capacitor (low-pass filter). An entire current waveform is positive-negative symmetrical as illustrated in FIG. 4(a). Therefore, filtering the data by the low-pass filter without any modification does not yield an envelope. In view of this, a negative signal section is cut from the data by the diode. After that, the resulting data is filtered by the low-pass filter, so that a waveform as those illustrated in FIG. 10(c) is generated as a modulated signal. The modulated signal is converted into digital data by, e.g., an analog-to-digital converter, and is then subjected to a subsequent process. FIG. 11 shows a half-wave rectifier circuit. Alternatively, a full-wave rectifier circuit may be employed. According to this technique, the number of peak positions in the current is doubled. Consequently, in a case where the power supply frequency is 60 Hz, it is possible to extract a modulated signal of up to 120 Hz.

FIG. 10 illustrates an analog circuit. Alternatively, a current signal may be converted into a digital value, data corresponding to a negative section may be removed or inverted into a positive signal, and thereafter the resulting signal may be filtered by a digital low-pass filter.

{Second Detection Technique}

Figure 12:
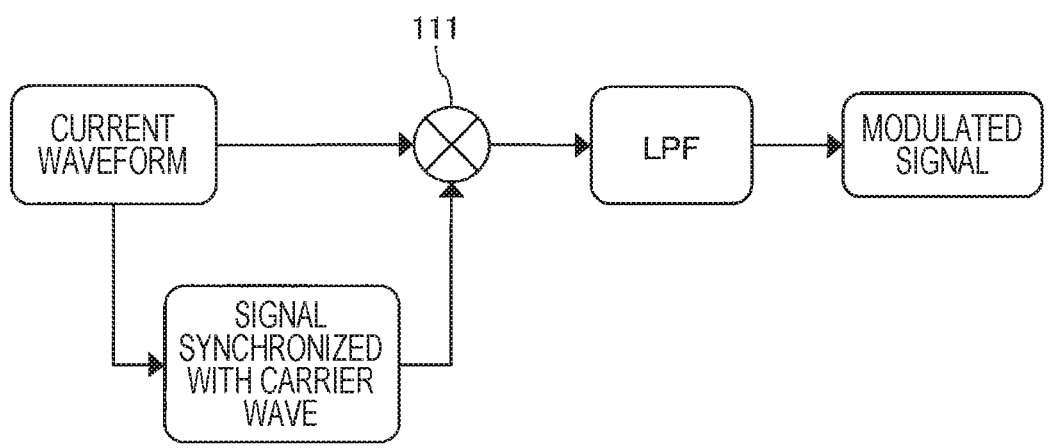
FIG. 12 is a view illustrating a second detection technique.

FIG. 12 is a view illustrating a second detection technique. The second detection technique is a technique that is called as synchronous detection or production detection. A measured current waveform and a cosine wave synchronized in phase with the measured current waveform are multiplied by each other by a multiplier denoted by the reference sign "111". As a result of this process, the positive-negative symmetrical waveform is converted into a waveform made of a positive section, and the modulated signal exhibits a modulated waveform with a frequency that is twice that of the carrier wave. Since the waveform is made of positive components, the diode is not necessary. Thereafter, an envelope is generated therefrom through a low-pass filter, so that a waveform as those illustrated in FIG. 10(c) is generated as a modulated signal. The modulated signal is converted into digital data by, e.g., an analog-to-digital converter, and is then subjected to a subsequent process. In a similar manner to the first detection technique, the second detection technique enables the detection process to be performed by a digital process and in a digital range.

{Third Detection Technique}

In the waveform illustrated in FIG. 10(b), it is shown that a modulated signal can be detected by taking peak values (maximum values) in the waveform of the driving current as sampling points. In view of this, maximum values in a single cycle of the waveform of the driving current may be detected and used as sampling points. In a case where this process is performed in an analog range, the detection of the maximum values may be performed by a peak-hold circuit. Meanwhile, in a case where this process is performed in a digital range, the detection of the maximum values may be performed by a process of detecting maximum values in a single cycle of the waveform of the driving current. According to this technique, the detection process can be performed even without taking any account of the frequency of the carrier wave.

{Fourth Detection Technique}

The frequency of the power source is well known. In a similar manner to the second detection technique, sampling may be performed on the waveform of the driving current at a time when a maximum value of a cosine wave synchronized in phase with the current waveform is observed. Consequently, a modulated signal can be generated. In a case where an inverter power source is used, there may be a switching noise and the like at or near a maximum value of a cosine wave synchronized with an inverter signal. In such a case, the sampling process may be performed in a phase shifted to a time when no noise exists.

Several detection processes have been described above. In addition to the detection processes described above, there exist other techniques for detecting an amplitude-modulated signal. Any of such techniques may be used to perform the detection process.

(Process S92)

Referring back to FIG. 9, the sampling unit 11A stores, in the storage unit 16, data corresponding to a predetermined window width and having been subjected to the time-series detection process.

(Process S93)

The frequency range conversion unit 12A converts the modulated signal into a frequency range. The conversion is Performed by, e.g., fast Fourier transform (FFT) or discrete Fourier transform (DFT).

Figure 13:
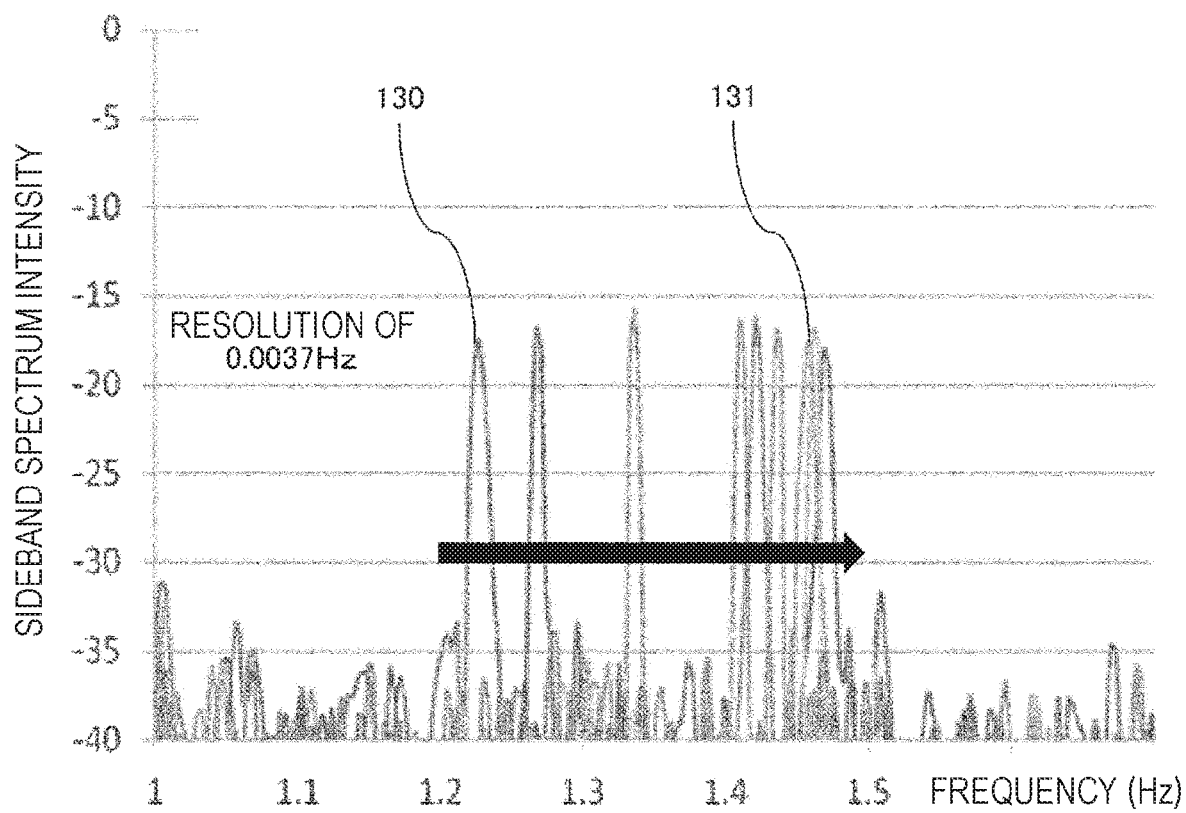
FIG. 13 is a view illustrating a sideband spectrum intensity after detection.

FIG. 13 is a view illustrating a sideband spectrum intensity after the detection. The horizontal axis represents a sideband frequency, and the vertical axis represents a sideband spectrum intensity. The spectrum illustrated in FIG. 13 corresponds to slip detected in the waveform of the driving current measured at different dates and times. A portion in the spectrum corresponding to the date and time A in FIG. 5 is 130 on the left side, and a portion in the spectrum corresponding to the date and time B in FIG. 5 is 131 on the right side. Along with lapse of operating time, the position in the spectrum moved from the left to the right. Since only the modulated signal was converted into the frequency range, a portion in the spectrum corresponding to slip did not appear as sidebands in both sides in the carrier wave as illustrated in FIG. 5. Instead, a sideband frequency $f_{pp}$ directly appeared as a portion of the spectrum.

In the example illustrated in FIG. 13, the FFT process was performed with a sampling rate of 60 Hz and 16384 data points. The frequency resolution was 0.0037 Hz. As compared to FIG. 5, the number of sampling points was reduced to one quarter of that of FIG. 5. Meanwhile, the frequency resolution was increased approximately 40 times that of FIG. 5. Consequently, it is possible to detect a small slip change.

(Process S94)

Referring back to FIG. 9, the sideband detection unit 13A detects a portion in the spectrum corresponding to the slip represented by the portions 130 and 131 in the spectrum illustrated in FIG. 13. Process S34 and the subsequent processes are the same as those in FIG. 3. Therefore, the description of these processes is omitted in the present embodiment. Note that the slip s calculated based on the frequency difference in process S34 corresponds to the frequencies at the portions 130 and 131 in the spectrum in FIG. 9. This will be described with reference to FIG. 14.

Figure 14:
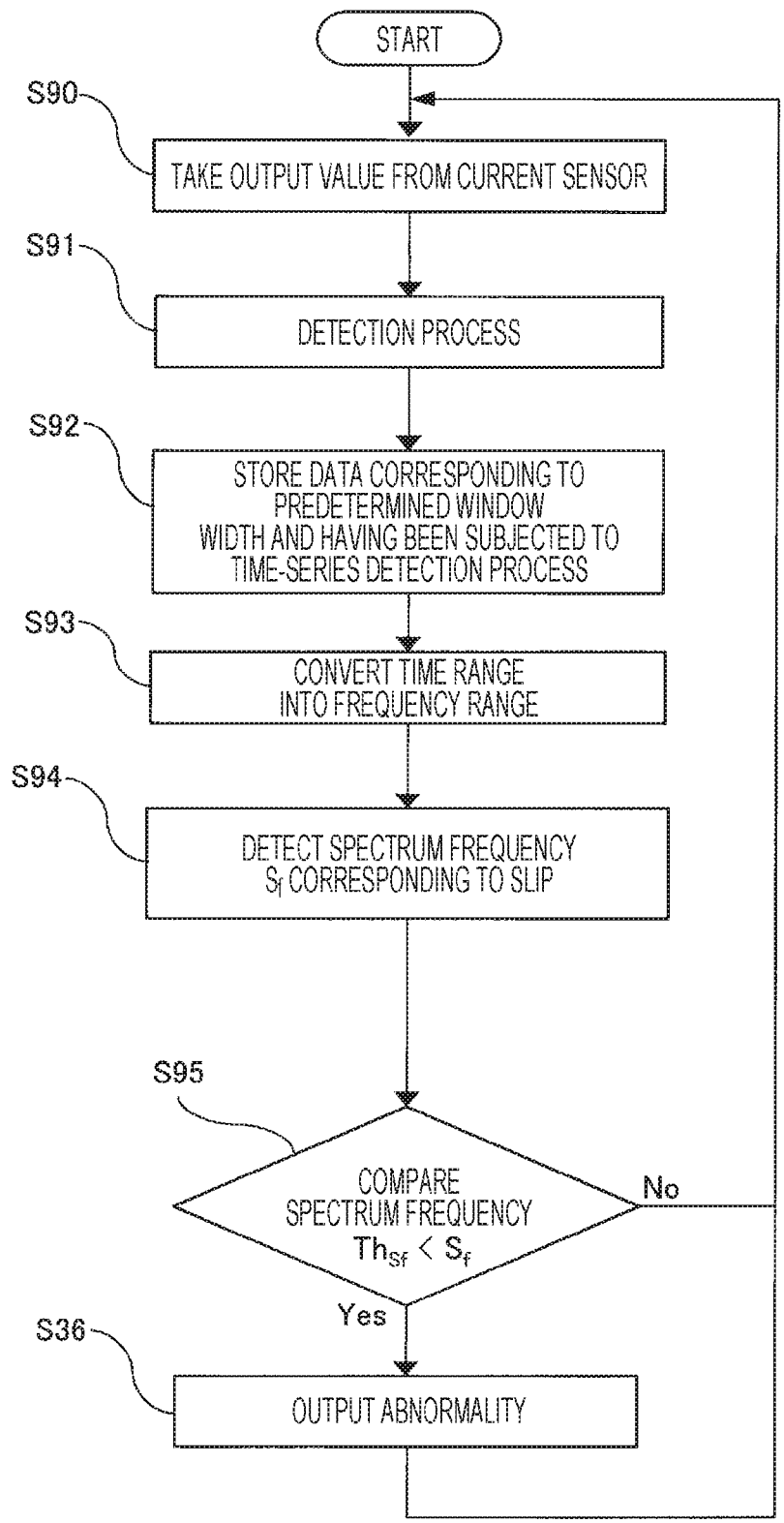
FIG. 14 is a flowchart illustrating other processes to be performed by the diagnostic device according to the second embodiment.

FIG. 14 is a flowchart illustrating other processes to be performed by the diagnostic device according to the second embodiment.

Comparing FIG. 14 to FIG. 9, process S94 and the subsequent processes in FIG. 14 are different from those in FIG. 9. According to FIG. 14, the abnormality detection unit 14 compares a spectrum frequency $S_f$ with a threshold $Th_{Sf}$ for a spectrum frequency in an abnormal state. If the spectrum frequency $S_f$ exceeds the threshold $Th_{Sf}$ for the spectrum frequency in the abnormal state (Yes in process S95; in a case of the abnormal state), the process advances to process S36. Meanwhile, if the spectrum frequency $S_f$ is not more than the threshold $Th_{Sf}$ for the spectrum frequency in the abnormal state (No in process S95), the process returns to process S90. Then, in process S36, in the case of the abnormal state, the abnormality detection unit 15 notifies the output unit 15 of the abnormality, and the process returns to process S90.

According to the present embodiment, a waveform of a driving current is subjected to a detection process and is then converted into a frequency range. Consequently, it is possible to detect a small slip change.

Third Embodiment

In a third embodiment, a diagnose process will be described, taking account of the same operation state.

The first and second embodiments have dealt with the rotary machine operated under a constant load. However, in some cases, the machine may be operated under a varying load. If the load varies, the mechanical output also varies, which results in a variation in slip. In view of this, taking account of changes in slip caused by the mechanical output, a method for detecting an abnormality by making a comparison among slip occurred in the same operation state will be described.

Figure 15:
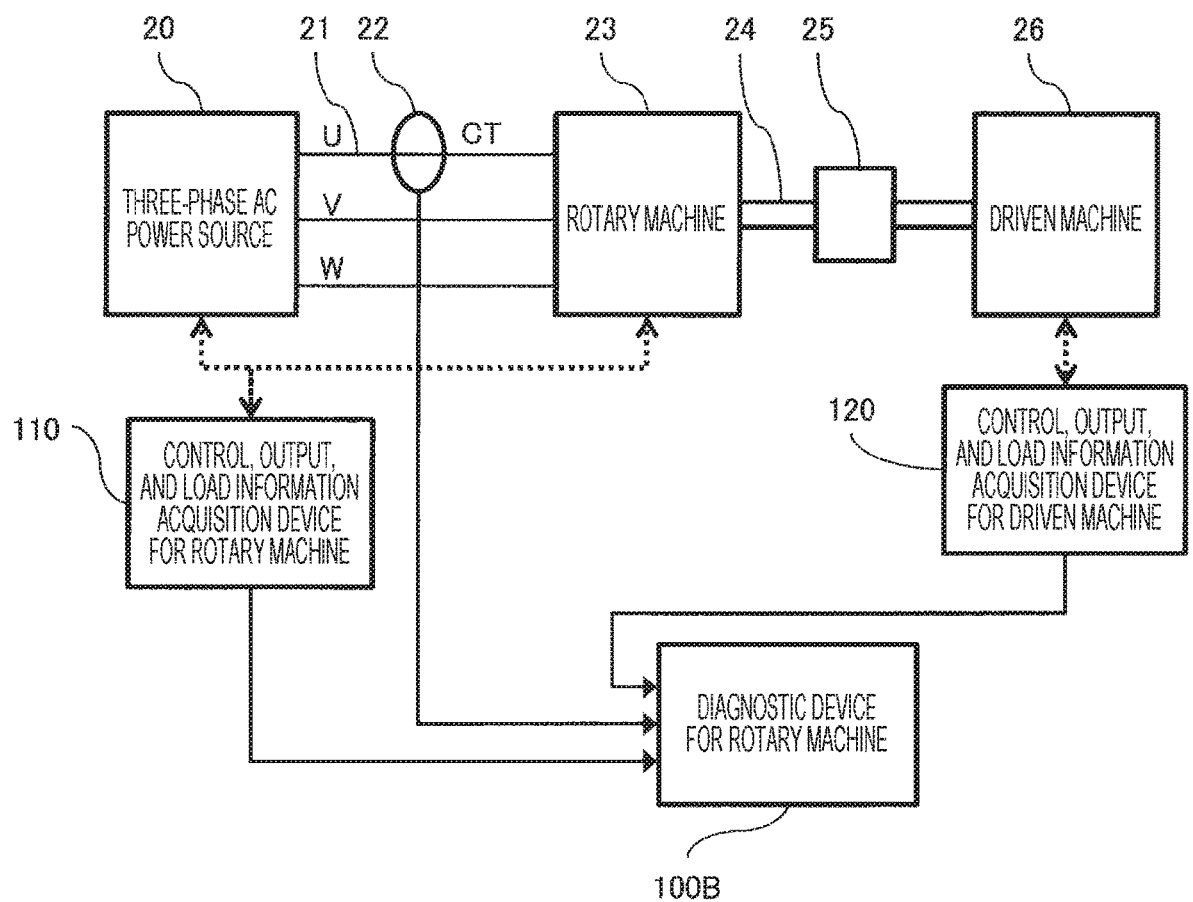
FIG. 15 is a view illustrating a configuration of a diagnostic device according to a third embodiment in which a variation in load is taken into account.

FIG. 15 is a view illustrating a configuration of a diagnostic device according to the third embodiment in which a variation in load is taken into account. The differences between FIGS. 15 and 1 are that the configuration illustrated in FIG. 15 includes a control, output, and load information acquisition unit 110 for a rotary machine and a control, output, and load information acquisition unit 120 for a driven machine.

Figure 16:
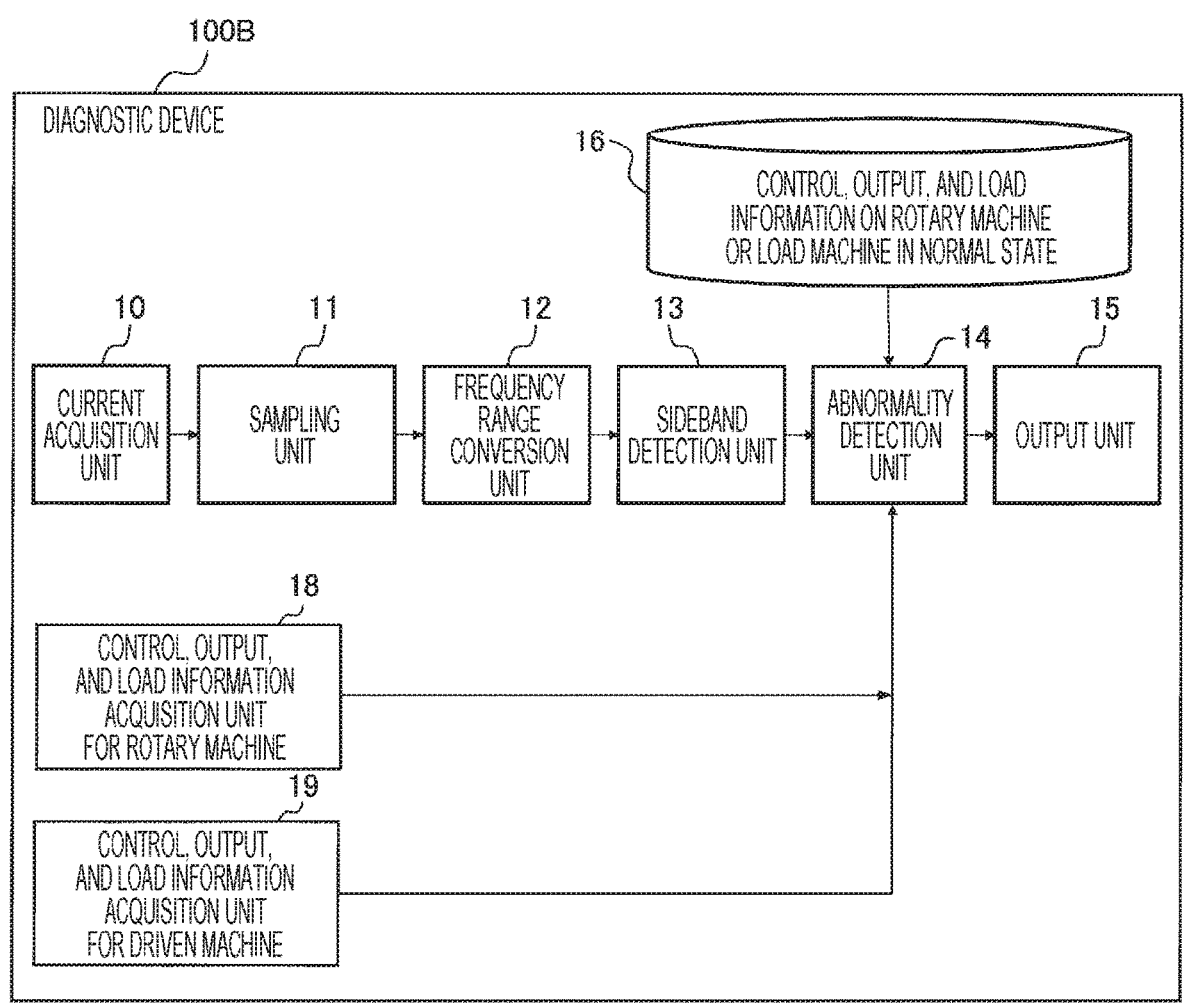
FIG. 16 is a view illustrating process blocks of the diagnostic device according to the third embodiment in which a variation in load is taken into account.

FIG. 16 is a view illustrating process blocks of the third embodiment in which a variation in load is taken into account. The differences between FIGS. 16 and 2 are that a diagnostic device 100B illustrated in FIG. 16 includes a control, output, and load information acquisition unit 18 for a rotary machine and a control, output, and load information acquisition unit 19 for a driven machine. Although not illustrated, the differences between FIGS. 16 and 8 are that the diagnostic device 100B illustrated in FIG. 16 includes the control, output, and load information acquisition unit 18 for the rotary machine and the control, output, and load information acquisition unit 19 for the driven machine.

From information acquired via the control, output, and load information acquisition unit 18 for the rotary machine and the control, output, and load information acquisition unit 19 for the driven machine, the diagnostic device 100E grasps operating states of the rotary machine and the driven machine, and observes time-dependent changes in slip in the same operation state. A slip state under the same condition may be represented as time-dependent changes as those illustrated in FIG. 6, and abnormality detection may be performed based on this. The information acquired via the control, output, and load information acquisition unit 18 for the rotary machine and the control, output, and load information acquisition unit 19 for the driven machine may be learnt as multi-dimensional vectors through, e.g., machine learning. If the state transfers to an abnormal state, it may be determined to be abnormal.

In summary, the diagnostic device 100B according to the third embodiment includes an operation state acquisition unit (the control, output, and load information acquisition unit 18 for the rotary machine and the control, output, and load information acquisition unit 19 for the driven machine) configured to acquire operation states of the rotary machine and the driven machine 26, wherein the abnormality detection unit 14 can determine whether or not the rotary machine 23 and the driven machine 26 have an abnormality, based on the frequencies of the sidebands under the same or similar condition having been acquired by the operation state acquisition unit.

The diagnostic device 100B according to the third embodiment includes the operation state acquisition unit configured to acquire operation states of the rotary machine and the driven machine 26, wherein the abnormality detection unit 14 can learn, through machine learning, a relation between the operation states acquired by the operation state acquisition unit in advance and the frequencies of the sidebands, and the abnormality detection unit 14 can determine whether or not the rotary machine and the driven machine have an abnormality, based on information obtained as a result of the learning, frequencies of current sidebands, and current operation states.

Fourth Embodiment

In a fourth embodiment, application of the present invention to a revolution indicator or a torque meter will be described.

In the first to third embodiments, the present invention has been described as a diagnostic device for making a diagnosis for an abnormality. Alternatively, the present invention may be a device for making a diagnosis on a revolution speed (the number of revolutions).

Slip s can be calculated by the following formula, based on a synchronized rotational frequency $f_x$ and a measured rotational frequency $f_R$.

$$s=(f_x-f_R)/f_x \quad (5)$$

Based on formulae (1) and (5), a measured rotational frequency $f_R$ of a rotary machine can be expressed as below, where $f_x$ denotes a synchronized rotational frequency, $f_{pp}$ denotes a sideband frequency, and $f_L$ denotes a power supply frequency:

$$f_R=f_x-(f_x \cdot f_{pp})/(2 \cdot f_L) \quad (6).$$

From this, the measured rotational frequency $f_R$ of the rotary machine is obtained. Based on this, it is possible to make a diagnosis on the number of revolutions. In addition, it is also possible to make a diagnosis on torque by converting the slip into torque based on the proportional relation between slip and torque, with reference to a slip vs. torque curve illustrated in FIG. 17.

The description of the first and second embodiments has mainly dealt with the diagnostic device 100, 100A. Here, finally, a diagnostic method for the rotary machine will be described. According to the diagnostic method, the diagnostic device 100 for the rotary machine may include and execute: a current acquisition process of acquiring a current from a sensor that measures a driving current of the rotary machine driving a driven machine; a sampling process of performing sampling on the driving current thus acquired; a frequency range conversion process of converting time-range data having been subjected to the sampling process into a frequency range; a sideband detection process of setting, in the frequency range, the driving current as a carrier wave and detect, as sidebands, portions of a spectrum appearing on both sides of the carrier wave having been amplitude-modulated; and an abnormality detection process of determining whether or not the rotary machine and the driven machine have an abnormality based on a frequency difference between at least one of frequencies of the sidebands detected in the sideband detection process and a frequency of the carrier wave.

The diagnostic device 100A for the rotary machine may include and execute: a current acquisition process of acquiring a current from a sensor that measures a driving current of the rotary machine driving a driven machine; a sampling process of performing sampling on a modulated signal obtained by setting the driving current as a carrier wave and performing a detection process on an amplitude-modulated part of the carrier wave; a frequency range conversion process of converting time-range data having been subjected to the sampling process into a frequency range; a sideband detection process of detecting, in the frequency range, sidebands that are portions of a spectrum corresponding to the modulated signal; and an abnormality detection process of determining whether or not the rotary machine and the driven machine have an abnormality based on frequencies at positions of the sidebands detected in the sideband detection process.

According to any of the diagnostic methods of the present embodiments, it is possible to detect, from a driving current, an abnormality (an increase in mechanical loss and/or copper loss) in a rotary machine and a driven machine to be driven by the rotary machine.

REFERENCE SIGNS LIST 10 current acquisition unit
11 sampling unit
11A sampling unit (detection unit)
12 frequency range conversion unit
13 sideband detection unit
14 abnormality detection unit
15 output unit
16 storage unit
18 control, output, and load information acquisition unit for rotary machine (operation state acquisition unit)
20 control, output, and load information acquisition unit for driven machine (operation state acquisition unit)
20 three-phase AC power source
21 U-phase
22 current sensor
23 rotary machine
24 rotation shaft
25 power transmission device
26 driven machine
100 diagnostic device

The invention claimed is:

1. A diagnostic device for a rotary machine, comprising:
a current acquisition unit configured to acquire a current from a sensor that measures a driving current of the rotary machine driving a driven machine;
a sampling unit configured to perform sampling on the driving current thus acquired;
a frequency range conversion unit configured to convert time-range data having been subjected to the sampling into a frequency range;
a sideband detection unit configured to set, in the frequency range, the driving current as a carrier wave and detect, as sidebands, portions of a spectrum appearing on both sides of the carrier wave having been amplitude-modulated; and
an abnormality detection unit configured to determine whether or not the rotary machine and the driven machine have an abnormality, based on a frequency difference between at least one of frequencies of the sidebands detected by the sideband detection unit and a frequency of the carrier wave.

2. The diagnostic device for a rotary machine according to claim 1, wherein the abnormality detection unit calculates slip based on the frequency difference, and detects an abnormality in the rotary machine and the driven machine based on time-dependent changes of the slip.

3. The diagnostic device for a rotary machine according to claim 2, wherein the abnormality detection unit calculates torque based on the slip, and outputs the torque to an output unit.

4. The diagnostic device for a rotary machine according to claim 1, further comprising:
an operation state acquisition unit configured to acquire operation states of the rotary machine and the driven machine, wherein
the abnormality detection unit determines whether or not the rotary machine and the driven machine have an abnormality, based on frequencies of the sidebands under a same or similar condition having been acquired by the operation state acquisition unit.

5. The diagnostic device for a rotary machine according to claim 1, further comprising:
an operation state acquisition unit configured to acquire operation states of the rotary machine and the driven machine, wherein
the abnormality detection unit learns, through machine learning, a relation between the operation states acquired by the operation state acquisition unit in advance and the frequencies of the sidebands, and
the abnormality detection unit determines whether or not the rotary machine and the driven machine have an abnormality, based on information obtained as a result of the learning, frequencies of current sidebands, and current operation states.

6. The diagnostic device for a rotary machine according to claim 1, wherein the abnormality detection unit calculates a rotational frequency of the rotary machine based on the frequency difference and the frequency of the carrier wave, and outputs the rotational frequency to an output unit.

7. A diagnostic device for a rotary machine, comprising:
a current acquisition unit configured to acquire a current from a sensor that measures a driving current of the rotary machine driving a driven machine;
a sampling unit configured to perform sampling on a modulated signal obtained by setting the driving current as a carrier wave and performing a detection process on an amplitude-modulated part of the carrier wave;
a frequency range conversion unit configured to convert time-range data having been subjected to the sampling into a frequency range;
a sideband detection unit configured to detect, in the frequency range, portions of a spectrum corresponding to the modulated signal as sidebands; and an abnormality detection unit configured to determine whether or not the rotary machine and the driven machine have an abnormality based on frequencies at positions of the sidebands detected by the sideband detection unit.

8. A diagnostic method for a rotary machine, wherein a diagnostic device for the rotary machine includes and executes:
- a current acquisition process of acquiring a current from a sensor that measures a driving current of the rotary machine driving a driven machine;
- a sampling process of performing sampling on the driving current thus acquired;
- a frequency range conversion process of converting time-range data having been subjected to the sampling process into a frequency range;
- a sideband detection process of setting, in the frequency range, the driving current as a carrier wave and detecting, as sidebands, portions of a spectrum appearing on both sides of the carrier wave having been amplitude-modulated; and
- an abnormality detection process of determining whether or not the rotary machine and the driven machine have an abnormality, based on a frequency difference between at least one of frequencies of the sidebands detected by the sideband detection unit and a frequency of the carrier wave.

9. The diagnostic method for a rotary machine according to claim 8, wherein the abnormality detection process calculates slip based on the frequency difference, and detects an abnormality in the rotary machine and the driven machine based on time-dependent changes of the slip.

* * * * *